United States Patent [19]

Matsukawa

[11] Patent Number: 4,700,457

[45] Date of Patent: Oct. 20, 1987

[54] METHOD OF MAKING MULTILAYER CAPACITOR MEMORY DEVICE

[75] Inventor: Takayuki Matsukawa, Itami, Japan

[73] Assignee: Mitsubishi Denki Kabushiki Kaisha, Tokyo, Japan

[21] Appl. No.: 823,100

[22] Filed: Jan. 27, 1986

[30] Foreign Application Priority Data

Mar. 29, 1985 [JP] Japan .................. 60-68155

[51] Int. Cl.$^4$ .................................... H01L 21/72
[52] U.S. Cl. .................. 437/52; 148/DIG. 14;
156/634; 437/60; 437/245
[58] Field of Search ............... 29/571, 576 C, 576 J,
29/577 C, 25, 42, 580; 357/23.6, 51, 71;
361/311, 312; 148/DIG. 14; 156/633, 634, 632;
427/79; 147/188

[56] References Cited

U.S. PATENT DOCUMENTS

| | | | |
|---|---|---|---|
| 4,156,249 | 5/1979 | Koo | 357/51 |
| 4,441,249 | 4/1984 | Alspector et al. | 29/577 C |
| 4,451,841 | 5/1984 | Hori et al. | 357/23.6 |
| 4,455,568 | 6/1984 | Shiota | 354/54 |
| 4,460,911 | 7/1984 | Salters | 357/23.6 |
| 4,507,171 | 3/1985 | Bhatia et al. | 29/576 W |

FOREIGN PATENT DOCUMENTS

| | | | |
|---|---|---|---|
| 2728928 | 1/1979 | Fed. Rep. of Germany | 357/23.6 |
| 0008871 | 1/1981 | Japan | 357/23.6 |
| 0112066 | 7/1982 | Japan | 357/23.6 |
| 0089450 | 5/1984 | Japan | 357/23.6 |

OTHER PUBLICATIONS

Bailey, "Thin-Film Multilayer Capacitors Using Pyrolytically Deposited Silicon Dioxide", IEEE Trns. on Parts, Hybrids, Packaging, vol. PHP-1, No. 4, pp. 361-364, DCC. 76.
"Novel High Density, Stacked Capacitor MOS RAM", M. Koyanagi et al., Jap. J. Appl. Phys., vol. 18, Supplement 18-1, pp. 35 to 42, 1979.
"A 64 kbit MOS Dynamic RAM with Novel Memory Capacitor", F. Smith et al., IEEE Trans. Solid-State Circuits, vol. SC-15, No. 2, Apr. 1980, pp. 184-189.
"Quadruply Self-Aligned Stacked High-Capacitance RAM Using $Ta_2O_5$ High-Density VLSI Dynamic Memory", K. Ohta, et al., IEEE Trans. Electron Devices, vol. ED-29, No. 3, Mar. 1982, pp. 368-376.

Primary Examiner—Brian E. Hearn
Assistant Examiner—Tom Thomas
Attorney, Agent, or Firm—Lowe Price LeBlanc Becker & Shur

[57] ABSTRACT

A semiconductor device comprising a capacitor of a laminated structure and a method of manufacturing thereof, in which first conductive layer and second conductive layer of different materials or different compositions are stacked alternately with dielectric films interposed therebetween and the first conductive layers and the second conductive layers are interconnected respectively at a time by suitably combining a selective etching method and an anisotropic etching method.

6 Claims, 12 Drawing Figures

METHOD OF MAKING MULTILAYER CAPACITOR MEMORY DEVICE

BACKGROUND OF THE INVENTION

1. Field of the Invention

The present invention relates to a structure of an increased capacitance of a capacitor for a semiconductor device utilizing the capacitor for charge storage, such as a MOS dynamic RAM, and a method of manufacturing thereof.

2. Description of the Prior Art

FIG. 1 is a view showing a sectional structure of a conventional MOS dynamic RAM cell. In FIG. 1, a MOS transistor serving as a transfer gate is formed by comprising an impurity diffusion layer 5 as a source and a drain formed at the surface of a semiconductor substrate 1; a gate oxide film 6 formed in a predetermined region on the semiconductor substrate 1; and a gate electrode 7 formed on the gate oxide film 6. On the other hand, a capacitor portion is formed by comprising a dielectric film 3 formed in a predetermined region on the surface of the substrate 1 and a capacitor electrode 4 formed on the dielectric film 3. The MOS transistor and the capacitor portion constitute a MOS dynamic RAM cell. The MOS dynamic RAM cell is electrically insulated from an adjacent device by an isolation oxide film 2.

Now, referring to FIG. 1, the operation of the above described device will be described. With the structure shown in FIG. 1, a memory cell is formed. In this structure, a single bit information is stored in the cell by determining either one of the two states, that is, either the state in which electric charge is stored in the capacitor portion or the state in which electric charge is discharged from the capacitor portion. A more detailed description will be given in the following. The so-called MOS type capacitor is formed by the semiconductor substrate 1, the dielectric film 3 and the capacitor electrode 4. The capacitor electrode 4 is maintained at a fixed potential so that electric charge corresponding to the capacitance of the capacitor can be stored in the interface between the semiconductor substrate 1 and the dielectric film 3. The transfer gate (the MOS transistor) formed by the gate oxide film 6 and the gate electrode 7 is electrically opened or closed according to a potential at the gate electrode so that the electric charge is stored in the capacitor (namely, writing information is performed) or so that it is determined whether or not the electric charge is stored in the capacitor (namely, reading information is performed). A more detailed description of these operations, omitted from this specification since there is no relation with the subject of the present invention, can be seen for example in "Introduction to MOS LSI Design" written by J. Mavor et al., University of Edinburgh, translated into Japanese by T. Sugano et al., Sangyo Tosho Co. (1983).

Generally, in a MOS dynamic RAM, the charge amount stored in the capacitor portion corresponds to the intensity of the signal. In such a conventional memory device as described above, it is always necessary to fabricate a capacitor and a transistor in a fixed area and therefore, if the area occupied by a cell is made smaller as a result of an improvement of an integration degree of an LSI (Large Scale Integrated Circuit), the area of the capacitor becomes also smaller accordingly. As a result, serious defects are involved that the storage capacity of the capacitor is considerably decreased, causing lack of stability to noise in memory operation.

As the prior art aiming at correcting the above stated defects, the following documents are known:

"Novel High Density Stacked Capacitor MOS RAM" (#) by M. Koyanagi, H. Sunami and N. Hashimoto, Jap. J. Appl. Phys., Vol. 18, Supplement 18-1, pp. 35 to 42, 1979, "A 64 Kbit MOS Dynamic RAM with Novel Memory Capacitor" (#) by F. Smith et al., IEEE Trans. Solid-State Circuits, Vol. SC-15, No. 2, April 1980, pp. 184 to 189, "Quadruply Self-Aligned Stacked High-Capacitance RAM Using $Ta_2O_5$ High-Density VLSI Dynamic Memory", IEEE Trans. Electron Devices, Vol. ED-29, No. 3 March 1982.

In all of these prior art documents, the storage capacity is increased by making a capacitor have a laminated structure. However, the method of forming a stacked capacitor disclosed in any of the above stated documents has a disadvantage that the laminated structure cannot include more than two layers.

SUMMARY OF THE INVENTION

The present invention has overcome the above described disadvantages and an object of the present invention is to provide a semiconductor device such as a MOS dynamic RAM in which even if the area of a cell is decreased as a result of a high degree of integration, a sufficient capacity of storage can be maintained without considerably increasing the number of mask alignment process for fine patterning and a soft error due to a noise of the power source or α rays can hardly occur.

A semiconductor device in accordance with the present invention comprises a capacitor for storing information charge which is formed in the below described manner. Stacked layers are formed by placing alternately thin electrode layers of different materials or compositions with dielectric films interposed therebetween and these stacked layers are subjected to an anisotropic etching process so that the stacked layers remain in predetermined regions and the whole side faces of the layers are exposed. Then, the whole side faces exposed by the anisotropic etching process are etched using an etching process which acts only on the thin electrode layers of either one of the materials or compositions. As a result, the side faces of those etched electrode layers are recessed and the spaces caused by the recession are filled with an insulating material so that the other electrode layers having the exposed side faces are electrically interconnected by means of a conductor.

More specifically, the conductor used for the electrical connection is polysilicon or silicide containing an impurity such as phosphorus, arsenic or the like. The impurity is thermally diffused from the portion of contact between the semiconductor substrate and the conductor into the semiconductor substrate. As a result, an impurity diffusion conductive region is formed in the semiconductor substrate and the impurity diffusion region and the conductor are electrically connected.

According to the present invention, the capacitor electrodes of a laminated structure can be electrically connected as a whole by combining suitable etching processes and thus, a capacitor of a multi-layer structure having a large capacitance can be obtained in a small area without increasing considerably the number of mask alignment process.

The above described object and other objects and features of the present invention will become more apparent from the following detailed description when taken in conjunction with the accompanying drawings.

DESCRIPTION OF THE PREFERRED EMBODIMENTS

Figure 1:
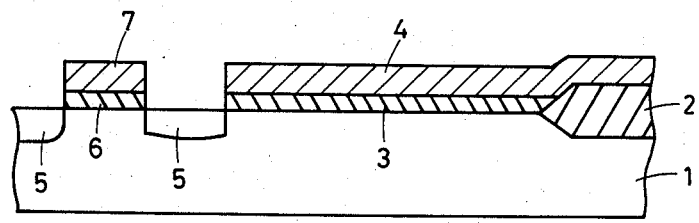
FIG. 1 is a sectional view showing schematically a structure of a memory cell of a conventional MOS dynamic RAM of the one-transistor and one-capacitor type.

FIGS. 2A to 2K are views showing sectional and plane structures of a capacitor in major manufacturing steps in accordance with an embodiment of the present invention. In the following, a method of manufacturing of a capacitor in accordance with an embodiment of the present invention will be described.

First, the step shown in FIG. 2A will be described. An isolation region 2 of a thick oxide film for electrical separation from an adjacent device is formed in a predetermined region on a semiconductor substrate 1 using a thermal oxidation process or the like. Then, using the same process as in a conventional device, on the exposed whole surface, first capacitor electrodes and second capacitor electrodes are stacked one upon another with dielectric films therebetween in the order of a dielectric film 3, a first capacitor electrode 4, a dielectric film 8, a second capacitor electrode 9, etc., so as to form a laminated structure. As an essential condition for forming the electrode layers, it is only required that the material or composition of the odd-numbered first electrode layers (4, 11 and 15 in FIG. 2A) as numbered from the semiconductor substrate 1 except the interlayer dielectric films and the material or composition of the even-numbered second electrode layers (9, 13 and 17 in FIG. 2A) should be different from each other. The materials of the first and second capacitor electrodes may be easily selected suitably among materials such as polysilicon, refractory metal silicide, a refractory metal and the like. These materials can be easily formed by a conventional film forming method such as a sputtering evaporation process or a CVD process. The interlayer dielectric films 3, 8, 10, 12, 14 and 16 may be formed by thermal oxidation of the respective underlying layers or by using a CVD process or a sputtering evaporation process. As the material of the interlayer dielectric films, silicon dioxide is most suitable but other materials such as silicon nitride ($Si_3N_4$) or tantalum pentoxide ($Ta_2O_5$) may be used. The material of the interlayer dielectric films does not have particular relation with the subject of the present invention. Then, after the formation of the laminated structure of a predetermined number of electrode layers, a patterned resist 18 having a plane form corresponding to the predetermined electrode pattern is formed on the stacked electrode layers. This resist layer 18 may be a single resist layer or a multilayer structure including a resist and other material having high resistance to dry etching.

Figure 2K:
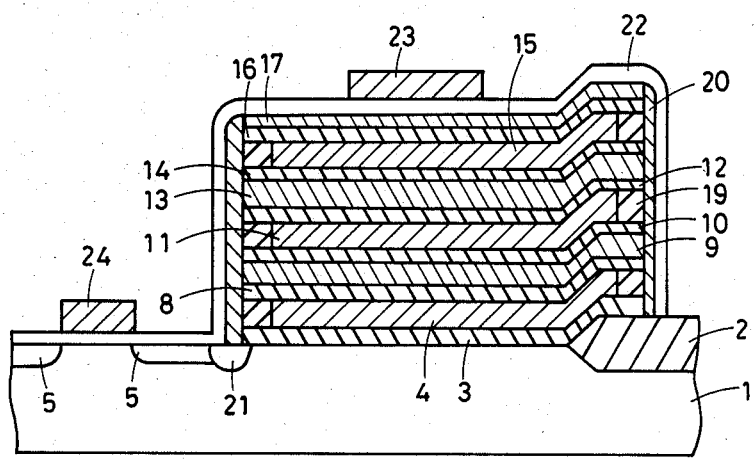
FIGS. 2A to 2K are views showing steps of forming a capacitor of a semiconductor device in accordance with the present invention.
Figure 2A:
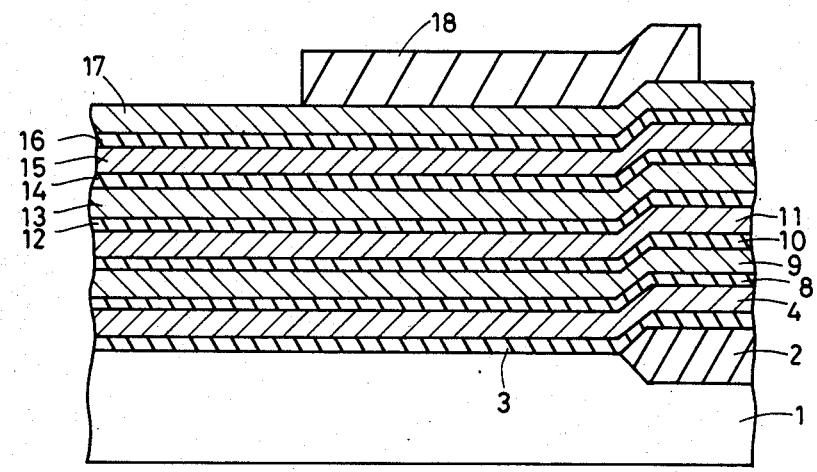
Figure 2B:
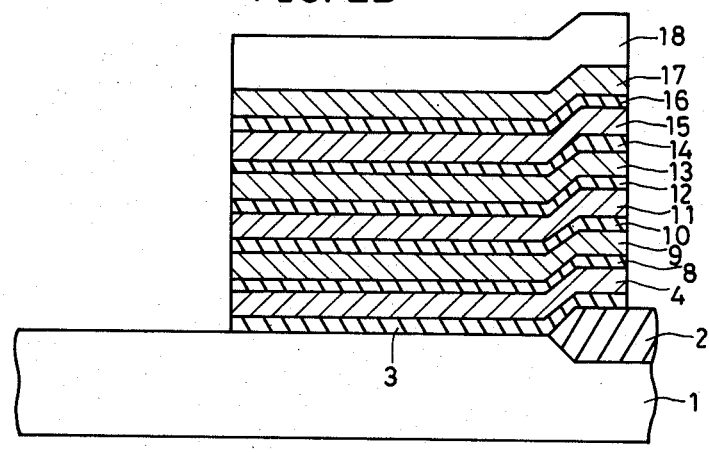

In a step shown in FIG. 2B, the whole structure of the stacked electrode layers is etched by an anisotropic plasma etching (RIE) process using the patterned resist layer 18 as a mask so that the stacked electrode layers are left only in predetermined regions, with all the side surfaces of the electrode layers being exposed.

Figure 2C:
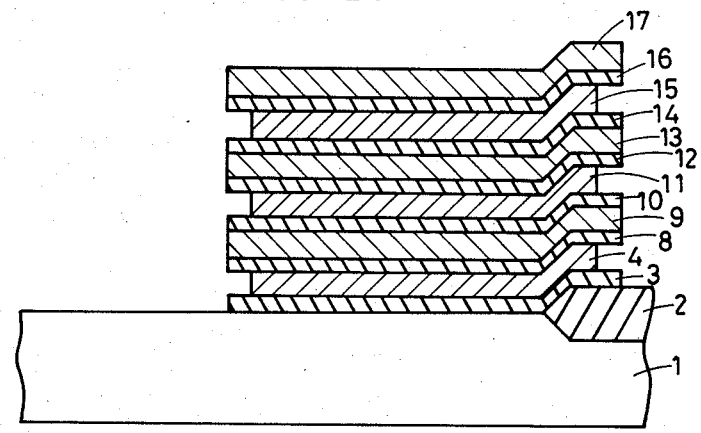

In a step shown in FIG. 2C, the photoresist layer 18 is removed and after that, the whole structure is lightly etched using an isotropic etching process such as wet or plasma etching so that only the first capacitor electrode layers 4, 11 and 15 are etched selectively. As a result, only the first capacitor electrode layers 4, 11, 15 are slightly recessed inward.

Figure 2D:
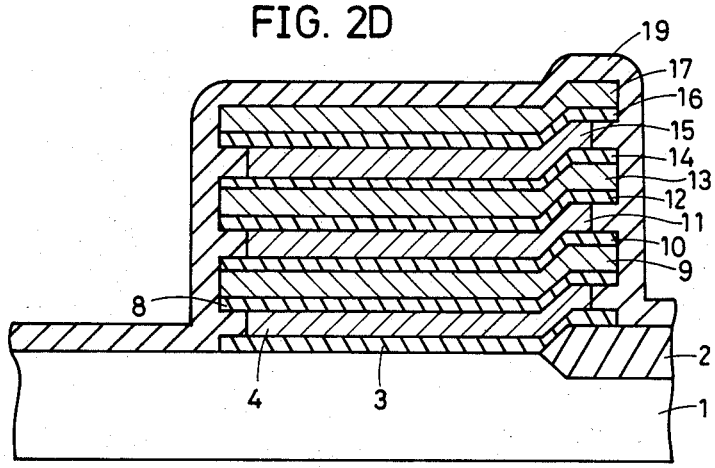

In a step shown in FIG. 2D, an insulating layer 19 of $SiO_2$ for example is formed over the whole exposed surface using a CVD process or the like. The thickness of the insulating layer 19 thus formed is at least equal to a value necessary for filling the gaps caused by the recession of the first capacitor electrode layers 4, 11, 15.

Figure 2E:
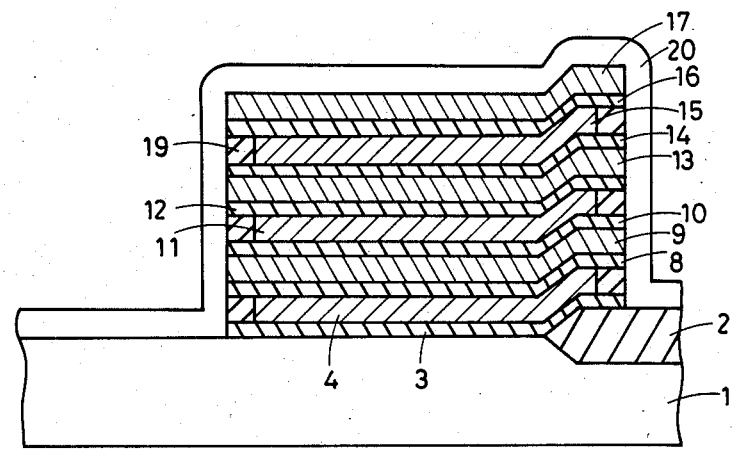

In a step shown in FIG. 2E, the insulating layer 19 is etched by an anisotropic plasma etching (RIE) process to that only the portions of the insulating layer 19 filled in the recessed portions of the first capacitor electrode layers 4, 11, 15 are left. Then, a conductive layer 20 is formed by a CVD process for example to cover the whole exposed surface.

Figure 2F:
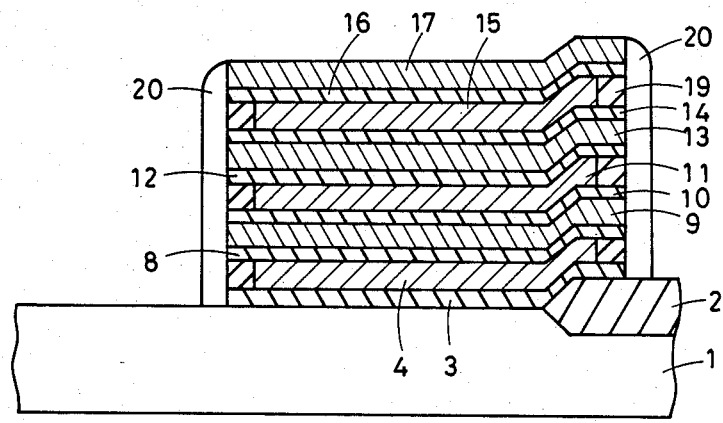

In a step shown in FIG. 2F, the conductive layer 20 is etched by an anisotropic etching process. As a result, the conductive layer 20 remains only on the side faces of the electrode layers so as to serve to electrically connect the second capacitor electrode layers 9, 13, 17. As the material of the conductive layer 20, materials such as polysilicon or refractory metal silicide containing an impurity such as phosphorus or arsenic are used.

Figure 2G:
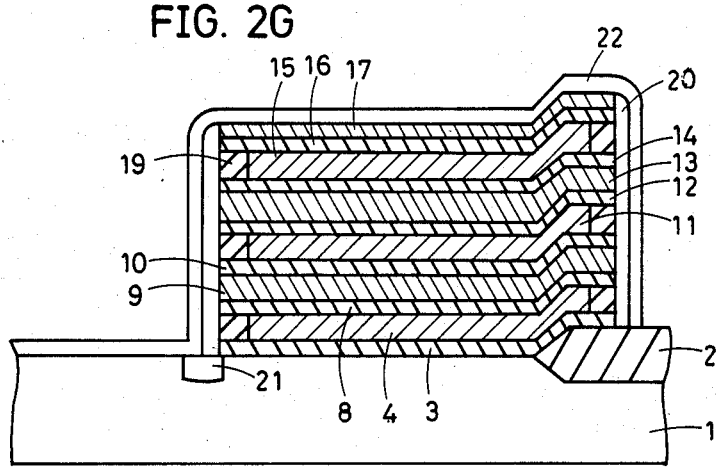

In a step shown in FIG. 2G, the whole structure is subjected to a heat treatment so that the impurity material contained in the conductive layer 20 is diffused into a portion of the semiconductor substrate 1 in contact with the conductive layer 20 in a self-alignment manner, whereby an impurity diffusion layer 21 is formed. After that, the whole area of the exposed surface is covered with an insulating layer 22 by a thermal oxidation process or a CVD process. This insulating layer 22 may be formed simultaneously with the above stated heat treatment for impurity diffusion from the conductive layer 20.

Figure 2H:
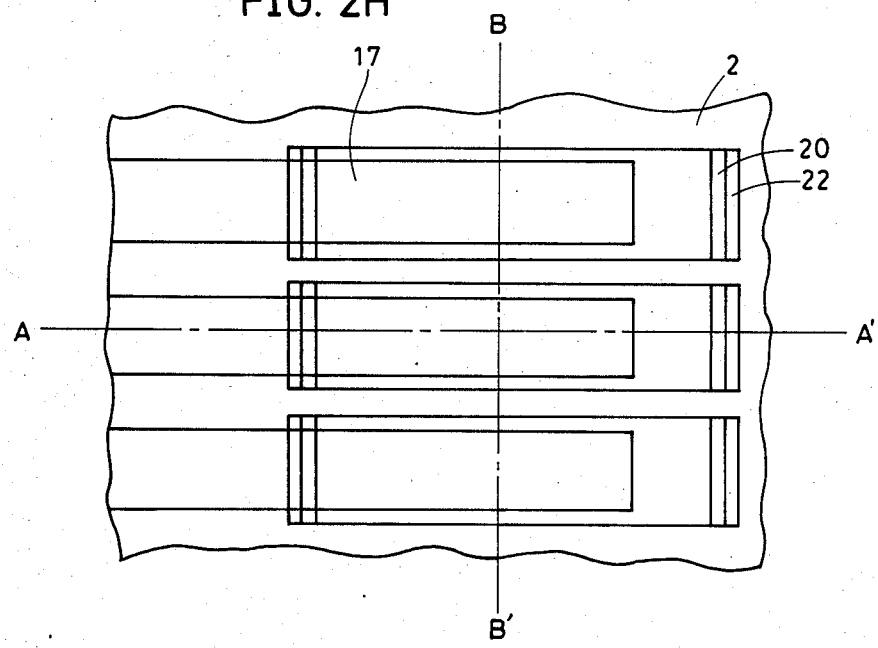

In a step shown in FIG. 2H, patterning is made by etching the whole structure using a process combining a resist pattern forming method and an anisotropic etching method so that the surface pattern is separated along the line B—B' shown in the figure (namely, the stacked electrode layers are separated). The sectional form in the direction of the line A—A' shown in FIG. 2H corresponds to the view in FIG. 2G.

Figure 2I:
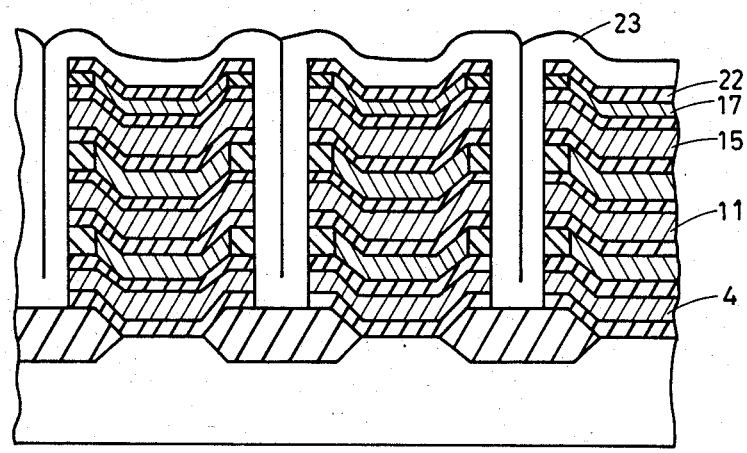

In a step shown in FIG. 2I, using the same method as for electrically connecting the second capacitor electrode layers, the first capacitor electrode layers 4, 11, 15 are interconnected by means of a conductive layer 23 along the line B—B' in FIG. 2H.

Figure 2J:
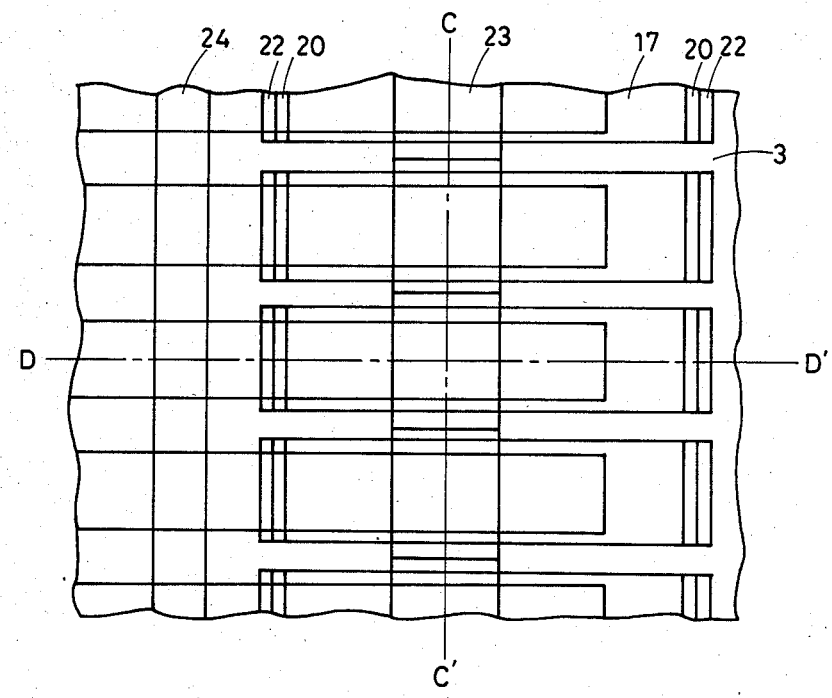

In a step shown in FIG. 2J, the conductive layer 23 is etched to have a predetermined plane form by a known photolithograghy process. The sectional structure taken along the line C—C' in FIG. 2J corresponds to the sectional view in FIG. 2I.

In a step shown in FIG. 2K, a transfer gate 24 is formed in a predetermined region using the same method as in a conventional device and an impurity diffusion layer 5 is also formed in a predetermined region using the same method as in a conventional device. As a result, as shown in FIG. 2K, a MOS dynamic RAM having a capacitor of a multilayered structure is formed. FIG. 2K corresponds to the sectional structure taken along the line D—D' in FIG. 2J showing a contrast with the conventional MOS dynamic RAM cell. As is clear from the comparison between FIG. 2K and FIG. 1, the storage capacity of a capacitor in an embodiment of the present invention can be made several times as large as the storage capacity of the conventional semiconductor device with almost the same area since the capacitance of the stacked portion is added. Furthermore, by increasing the number of layers in the stacked portion, it is made possible to increase the capacitance as desired. On the other hand, the number of times a mask pattern is formed for obtaining a capacitor of this multilayered type is increased only by two as compared with the case of the conventional device since the capacitor electrode layers in this invention are electrically interconnected.

Although in the above described embodiment, the capacitor electrode layers are six, it goes without saying that any number of capacitor electrode layers may be adopted as far as it is more than two.

In addition, although in the above described embodiment, the even-numbered capacitor electrode layer (the second capacitor electrode layer) is electrically connected with the semiconductor substrate, it goes without saying that the same effect can be obtained if an odd-numbered capacitor electrode layer (the first capacitor electrode layer) is electrically connected with the semiconductor substrate.

Furthermore, although in the above described embodiment, an example of forming a capacitor of a MOS dynamic RAM was shown, it is needless to say in view of the subject of the present, invention that a method in accordance with the present invention is applicable to any case for forming a capacitor in a semiconductor device.

Thus, according to the present invention, by combining suitably anisotropic etching and isotropic etching processes, the even-numbered electrode layers and the odd-numbered electrode layers of a capacitor of laminated structure are electrically connected respectively at a time and consequently, a capacitor having a large capacitance can be effectively formed in a small area without considerably increasing the frequency of mask alignment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing of a capacitor included in a semiconductor device formed on a semiconductor substrate, comprising the steps of:
    forming multiple layered film over the whole surface of said semiconductor substrate by placing alternately first conductive layer and second conductive layer of different etching characteristics with dielectric film therebetween,
    applying an anisotropic etching process to said multiple layered film formed by said first step so that said multiple layered film remain only in predetermined regions with all the side faces of said multiple layered film being exposed,
    etching all the side faces of said multiple layered film exposed by said second mentioned step using an etching process preferentially acting on said first conductive layers so that the side faces of said first conductive layers are recessed inward with the side faces of said second conductive layers being kept unchanged,
    filling the gaps made by said recession of said first conductive layers with an insulating material, and
    electrically interconnecting said second conductive layers having the exposed side faces by using a conductor.

2. A manufacturing method in accordance with claim 1, wherein
    said first conductive layers and said second conductive layers are formed on said semiconductor substrate alternately in the order of first to second layers with said dielectric film being interposed.

3. A manufacturing method in accordance with claim 1, wherein
    said second conductive layers and said first conductive layers are formed on said semiconductor substrate alternately in the order of second to first layers with said dielectric film being interposed.

4. A manufacturing method in accordance with claim 1, wherein said conductor used for said electrical interconnection is formed of polysilicon containing an impurity which is to be diffused in said semiconductor substrate so as to form a conductive region, said conductor being in contact with said semiconductor substrate, and said impurity is thermally diffused from said conductor into said semiconductor substrate to form an impurity diffusion region whereby said conductor is electrically connected with said impurity diffusion region.

5. A manufacturing method in accordance with claim 1, wherein said conductor used for said electrical interconnection is formed of silicide containing an impurity which is to be diffused in said semiconductor substrate so as to form a conductive region, said conductor being in contact with said semiconductor substrate, and said impurity is thermally diffused from said conductor into said semiconductor substrate to form an impurity diffusion region whereby said conductor is electrically connected with said impurity diffusion region.

6. A manufacturing method in accordance with claim 1, wherein said semiconductor device is a semiconductor memory device for storing information in said capacitor.

* * * * *